United States Patent [19]

Miyake

[11] Patent Number: 5,198,905

[45] Date of Patent: Mar. 30, 1993

[54] IMAGE SENSOR HAVING AN ELECTRICAL INTERFERENCE REDUCING WIRE STRUCTURE

[75] Inventor: Hiroyuki Miyake, Kanagawa, Japan

[73] Assignee: Fuji Xerox Co., Ltd., Tokyo, Japan

[21] Appl. No.: 746,725

[22] Filed: Aug. 19, 1991

[30] Foreign Application Priority Data

Aug. 20, 1990 [JP] Japan ................................. 2-217092

[51] Int. Cl.⁵ ...................... H04N 3/14; H04N 5/335
[52] U.S. Cl. ............................ 358/213.11; 358/213.31
[58] Field of Search ..................... 358/213.31, 213.15, 358/213.11, 483; 250/578.1

[56] References Cited

U.S. PATENT DOCUMENTS

| | | | |
|---|---|---|---|
| 4,453,187 | 6/1984 | Komiya et al. | 358/213.31 |
| 4,499,384 | 2/1985 | Segawa et al. | 358/213.11 |
| 4,767,936 | 8/1988 | Murakami et al. | 358/213.11 |
| 4,858,022 | 8/1989 | Suzuki | 358/213.15 |
| 4,896,216 | 1/1990 | Brunst et al. | 358/213.11 |
| 5,065,171 | 11/1991 | Miyake et al. | 358/213.31 |
| 5,097,338 | 3/1992 | Kuriyama et al. | 358/213.31 |

FOREIGN PATENT DOCUMENTS

| | | | |
|---|---|---|---|
| 58-039174 | 3/1983 | Japan | 358/213.31 |
| 63-9358 | 1/1988 | Japan . | |
| 63-310166 | 12/1988 | Japan . | |

*Primary Examiner*—Michael T. Razavi
*Assistant Examiner*—Wendy R. Greening

*Attorney, Agent, or Firm*—Finnegan, Henderson, Farabow, Garrett and Dunner

[57] ABSTRACT

An image sensor having a photodetecting element array including a plurality of blocks linearly arrayed in a first scan direction, each block compromising a plurality of photodetecting elements, a plurality of switching elements for transferring charges generated in the photodetecting elements, and a drive IC for outputting the charges in the form of image signals. The switching elements in a block and the switching elements in another block located adjacent to the former block are connected by signal lines, in order of linear proximity to each other. The signal lines connecting the switching elements in a block to the switching elements in blocks on both sides of the former block are disposed oppositely with respect to the first scan direction, and are disposed in such a way that the shortest signal line is located closest to the photodetecting element array, the next shortest signal line is located next closest to the photodetecting element array, and so on. Further, a first wire at a fixed potential is disposed between the signal lines adjacent to each other. A second wire at the fixed potential is disposed outside the signal line which is located farthest from the photodetecting element array. Furthermore, a dummy wire for generating a voltage waveform in synchronism with that on each of the signal lines, the polarity of both the voltage waveforms being the same, is disposed outside the second wire.

4 Claims, 7 Drawing Sheets

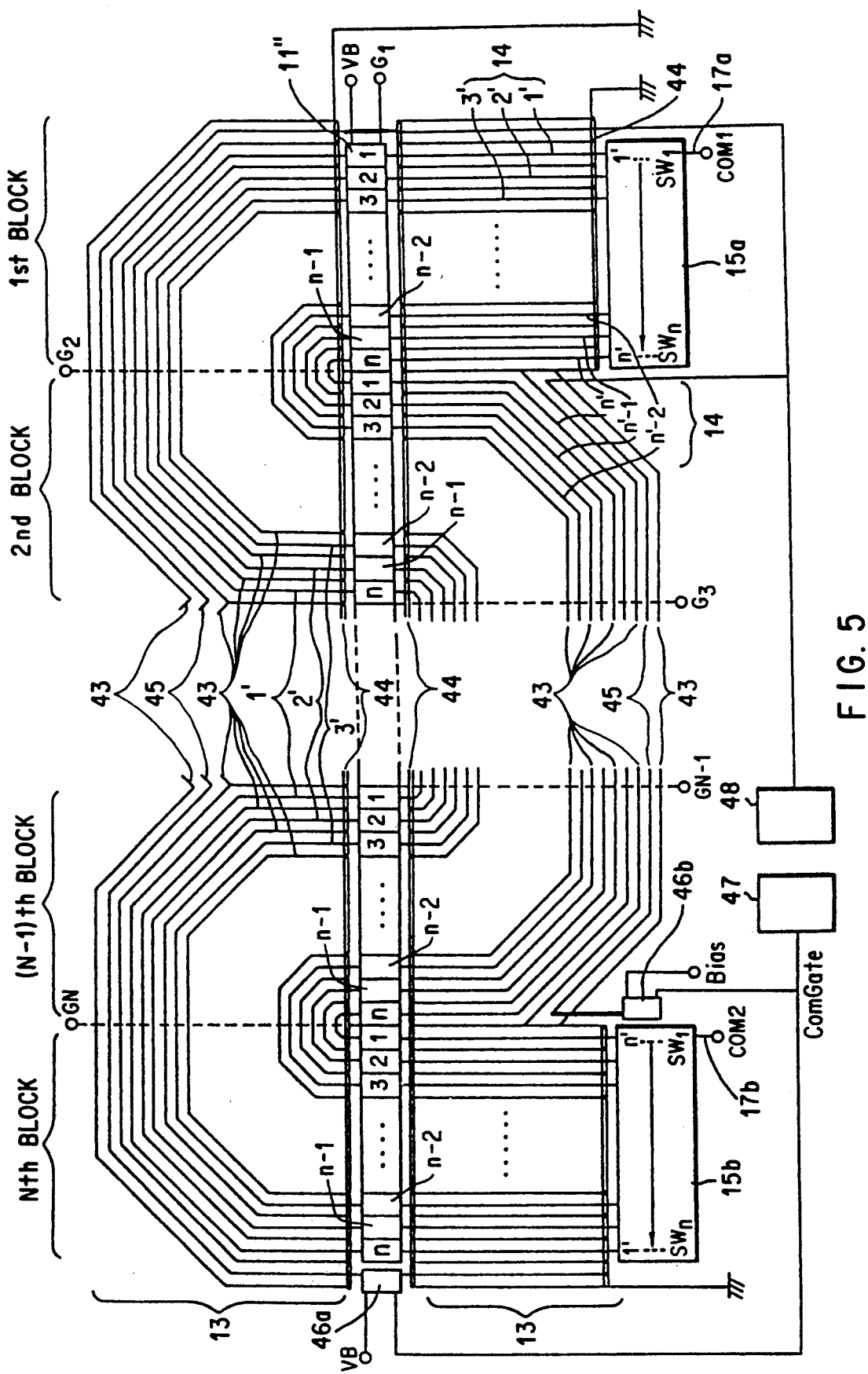
F I G. 5

IMAGE SENSOR HAVING AN ELECTRICAL INTERFERENCE REDUCING WIRE STRUCTURE

BACKGROUND OF THE INVENTION

1. Field of the Invention

The present invention relates to an image sensor used for facsimiles, scanners and the like, and more particularly to an image sensor having a wiring structure with a less electrical influence among interconnection wires.

2. Discussion of the Related Art

In the conventional image sensors, particularly close-contact type image sensors, there is known an image sensor of the type in which image data of a document is projected onto the sensor in a one-to-one correspondence and the projected image is converted into electrical signals. A TFT (Thin Film Transistor) driven image sensor belonging to the category of this type of the image sensor has been used. In the TFT driven image sensor, the projected image is divided into a great number of picture elements (photodetecting elements), charges generated in the photodetecting elements are temporarily stored every specific block of photodetecting elements in the wiring capacitances existing between the wires by using thin film transistor switching elements, and the charges are time-sequentially read out of the wiring capacitances in the form of electrical signals at a speed of several hundreds KHz to several MHz. In the TFT driven image sensor, the image can be read using a single drive IC, through the operation of the TFT. Therefore, the number of drive ICs for driving the image sensor can be reduced.

The TFT driven image sensor, as shown in FIG. 8 showing an equivalent circuit of the image sensor, is made up of a linear photodetecting element array 51 having a length substantially equal to the width of a document, a charge transfer section 52 consisting of a plurality of thin film transistors $T_{i,j}$ ($i=1$ to N, $j=1$ to n) provided in association with photodetecting elements 51" in one-to-one correspondence, and a matrix-arrayed, multilayered wiring structure 53.

The photodetecting element array 51 is divided into photodetecting element groups of an "N" number of blocks. The "n" number of photodetecting elements 51" forming one group may be equivalently expressed by photo diodes $P_{i,j}$ ($i=1$ to N, $j=1$ to n). The photodetecting elements 51" are respectively connected to the drain electrodes of the thin film transistors $T_{i,j}$.

The source electrodes of the thin film transistors $T_{i,j}$ are respectively connected, every group of photodetecting elements, to the "n" number of common signal lines 54 through the multilayered wiring structure 53. The signal lines 54 are connected to a drive IC 55.

The gate electrodes of the thin film transistors $T_{i,j}$ are connected to a gate pulse generator 56 so that the transistors of each block are rendered conductive simultaneously. The optical charges generated in the photodetecting elements 51" are stored, for a predetermined period of time, in the stray capacitance of each photodetecting element and the overlap capacitance between the drain and gate of each thin film transistor. Then, the charges are sequentially transferred in each block to the wiring capacitances $C_i$ ($i=1$ to n) of the multilayered wiring structure 53. During the charge transfer operation, the thin film transistors $T_{i,j}$ serve as charge transfer switches.

A gate pulse $\phi G1$ is transferred from the gate pulse generator 56 through the gate signal lines G1 to the thin film transistors T1,1 to T1,n of the first block, to turn them on. The charges generated in the photodetecting elements 51" of the first block are transferred to and stored in the wiring capacitances $C_i$. By the charges stored in the wiring capacitances $C_i$, the potentials in the common signal lines 54 is varied. The varied voltages are time-sequentially introduced onto an output line 57 by successively turning on analog switches $SW_i$ ($i=1$ to n) in the drive IC 55.

In response to the gate pulses $\phi G2$ to $\phi Gn$, the transistors T2,1–T2,n to TN,1–TN,n in the second to N-th blocks are turned on, so that the charges of the photodetecting elements are transferred every block, thereby obtaining an image signal of one line in the first scan direction on an original document. The original is moved by means of a document feed means (not shown), such as rollers, and the sequence of the operations as stated above is repeated. Finally, image signals of the whole document are obtained (Japanese Patent Application Unexamined Publication No. Sho. 63-9358).

FIG. 9 is a plan view showing the construction of the multilayered wiring structure, and FIG. 10 is a cross section taken on line C—C' in FIG. 9. As shown in these figures, the multilayered wiring structure 53 is constructed with a substrate 21, lower layer signal lines 31, an insulating layer 33, and an upper layer signal lines 32. In the structure, the signal line 31, the insulating layer 33 and the signal lines 32 are multilayered on the substrate 21. The signal lines 31 and 32 are arranged crossing each other. Contact holes 34 are provided for interconnection of the upper and lower signal lines.

As described, in the construction of the conventional image sensor, the multilayered wiring structure has the matrix construction such that the upper and lower signal lines cross each other with the insulating layer 33 being interlayered therebetween, as shown in FIG. 10 Accordingly, a coupling capacitance exits at each cross point of the lower and upper layer signal lines 31 and 32. The coupling capacitance causes a potential difference between the upper and the lower lines at each cross portion. The output signal from one of the signal lines is influenced by the output signal from the other. That is, crosstalk occurs preventing the charge from being detected exactly. Hence, the tone or gradation reproduction of the image sensor is deteriorated.

To cope with the problem, there is proposed an image sensor having a photodetecting element array including a plurality of blocks linearly arrayed in the first scan direction, each block consisting of a preset number of photodetecting elements, a plurality of switching elements for transferring charges generated in the photodetecting elements of each block, and a drive IC for outputting the charges in the form of image signals, wherein the switching elements in a block of the photodetecting element array and the switching elements in another block located adjacent to the former block are connected by wires in such a way that the switching elements closest to each other between the blocks are interconnected, the switching elements next close to each other are interconnected, and so on, and the wires connecting the switching elements in a block to the switching elements in blocks on both sides of the former block are disposed oppositely with respect to the first scan direction, and are disposed in such a way that the shortest wire connecting them is located closest to the photodetecting element array, the next shortest wire is located next closest to the photodetecting element array, and so on.

The image sensor thus arranged is free from the interference among the signal lines, and ensures an exact read of charges from the wiring capacitances because the signal lines do not cross each other.

However, in the image sensor, an "n" number of signal lines in parallel to each other meander through the photodetecting element array, and coupling capacitances are present among those parallel signal lines. Therefore, a potential difference is present between the adjacent signal lines, so that one signal line is influenced by the other adjacent to the former, and crosstalk occurs. As a result, an exact potential detection is impossible, deteriorating the tone reproduction performance of the image sensor.

When load capacitors are formed in the wiring portion of the image sensor, the load capacitors for the signal lines must be uniform in capacitance in order to exactly read the charges from the signal lines. When downsizing of the image sensor is intended, the areas for the load capacitors must be decreased.

In the image sensor, the signal lines within the wiring structure are electrically influenced from one another since the potentials in the signal lines vary owing to the charge transfer. In this case, the signal line located farthest from the photodetecting element array is electrically influenced by the signal line located on the inner side of the former, but is not influenced from its outside because no signal line is disposed outside the outermost signal line. The electrical influence received by the outermost signal line is different from that of the inner signal lines. Therefore, the output voltages of the signal lines are not equal.

SUMMARY OF THE INVENTION

The present invention has been made in view of the above circumstances and has an object to provide an image sensor which minimizes the electrical interference among the signal lines and hence can exactly output charges from signal lines.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as mentioned and broadly described herein, the image sensor of the invention has a photodetecting element array including a plurality of blocks linearly arrayed in a first scan direction, each block consisting of a plurality of photodetecting elements, a plurality of switching elements for transferring charges generated in the photodetecting elements of each block, and a drive IC for outputting the charges in the form of image signals, wherein the switching elements in a block of the photodetecting element array and the switching elements in another block located adjacent to the former block are connected by wires, as signal lines, in order from the closest switching elements between the blocks, the signal lines connecting the switching elements in a block to the switching elements in blocks on both sides of the former block are disposed oppositely with respect to the first scan direction, and are disposed in such a way that the shortest signal line is located closest to the photodetecting element array, the next shortest signal line is located next closest to the photodetecting element array, and so on. The image sensor further comprises a first wire at a fixed potential disposed between the signal lines adjacent to each other, a second wire at the fixed potential disposed outside the signal line which is located farthest from the photodetecting element array, and a dummy wire for generating a voltage waveform in synchronism with that on each of the signal lines, the polarity of both the voltage waveforms being the same, disposed outside the second wire.

BRIEF DESCRIPTION OF THE DRAWINGS

The accompanying drawings, which are incorporated in and constitute a part of this specification, illustrate an embodiment of the invention and, together with the description, serve to explain the objects, advantages and principles of the invention.

In the drawings,

FIG. 5 is a plan view showing how wire groups are laid out in the image sensor;

DETAILED DESCRIPTION OF THE PREFERRED EMBODIMENT

A preferred embodiment of an image sensor according to the present invention will be described with reference to the accompanying drawings.

Figure 1:
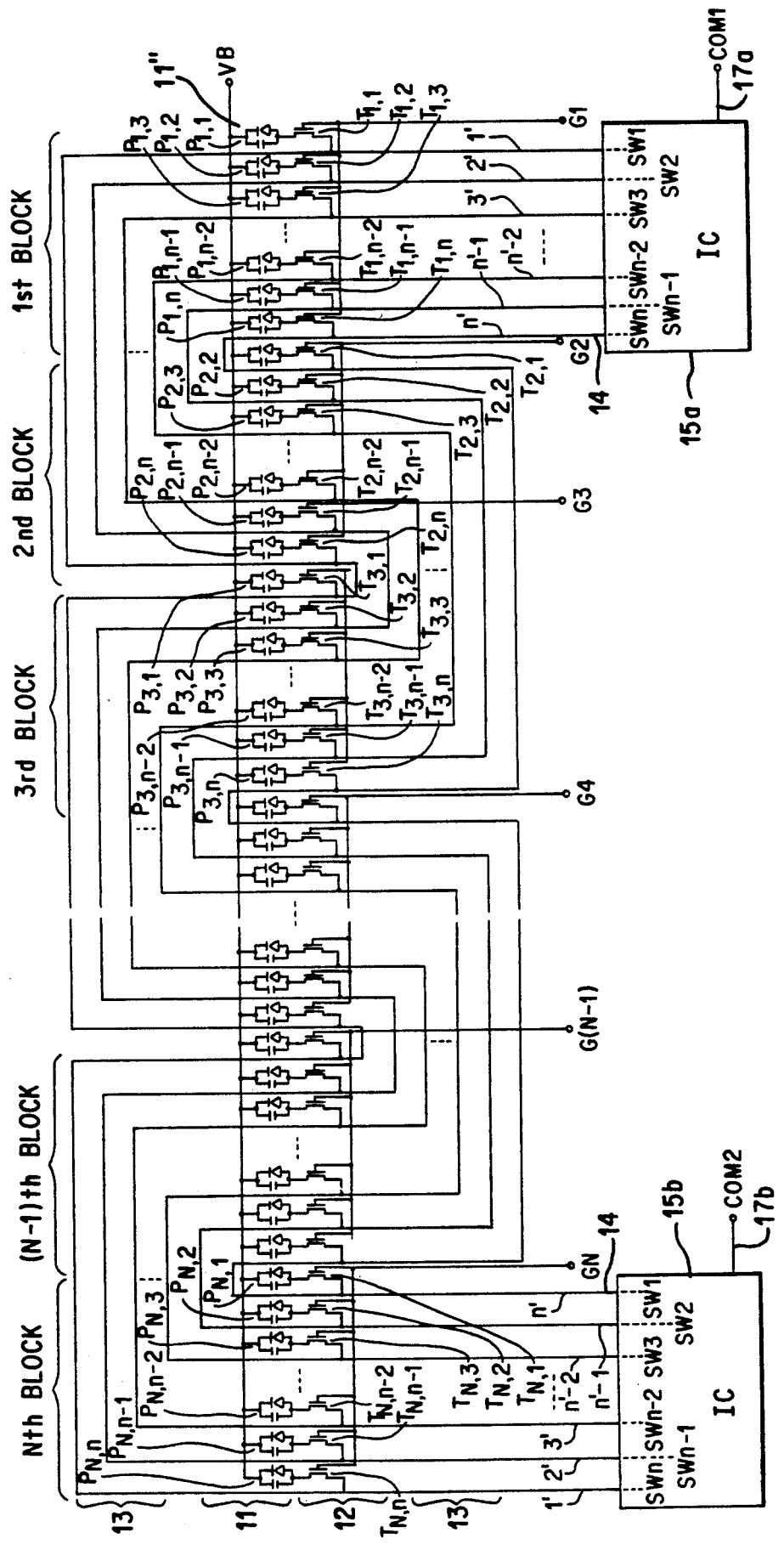
FIG. 1 is an equivalent circuit diagram showing an image sensor according to an embodiment of the present invention.
Figure 2:
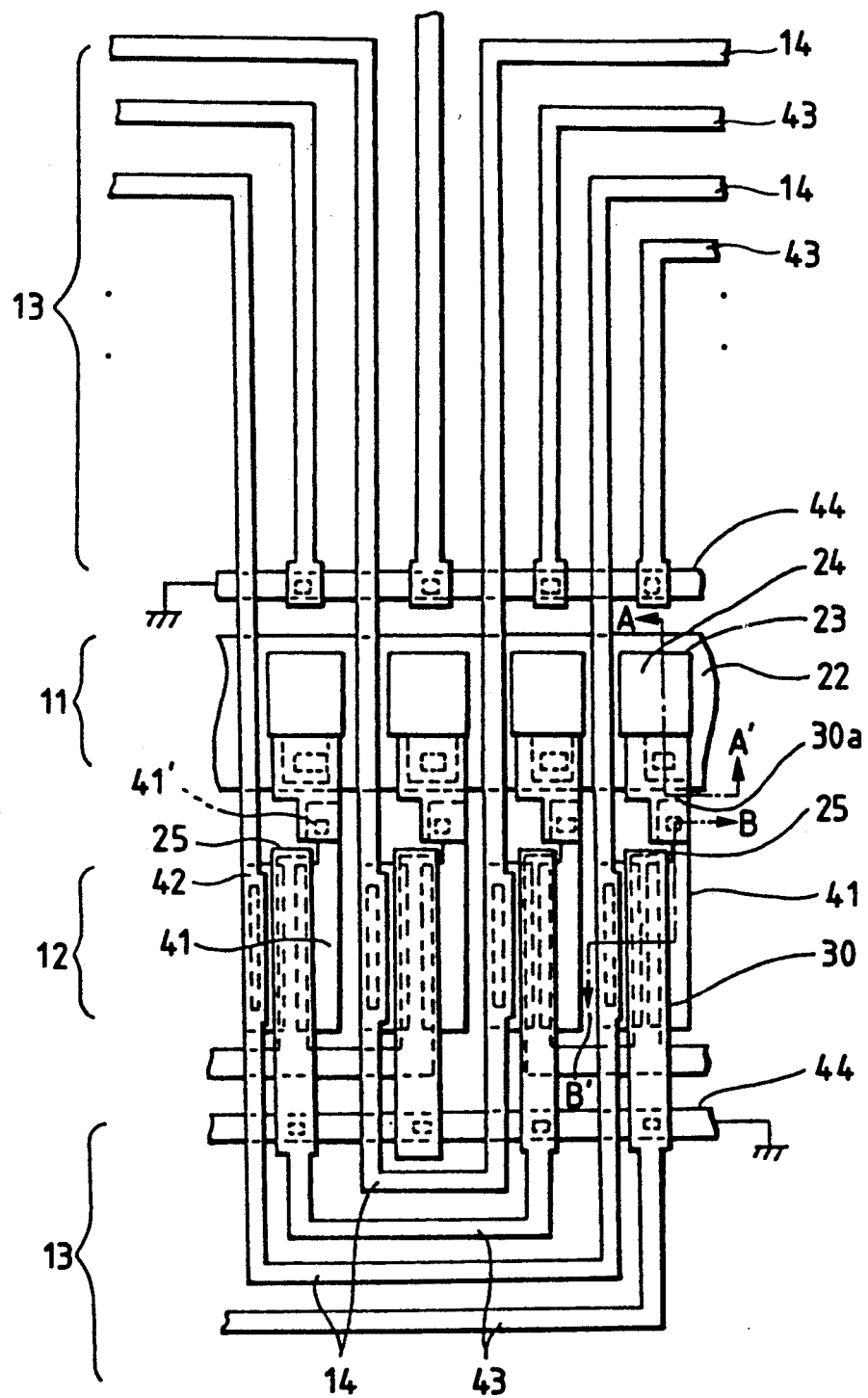
FIG. 2 is a plan view showing a part of the image sensor of FIG. 1, in which photodetecting elements, a charge transfer section, and a wire group are illustrated.

FIG. 1 is an equivalent circuit diagram showing an image sensor according to an embodiment of the present invention. FIG. 2 is a plan view showing a partial structure of the image sensor in which photodetecting elements, a charge transfer section, and a part of a wiring structure are included.

As shown in FIG. 1, the image sensor includes a photodetecting element array 11 (containing photo diodes P1,1 to PN,n) consisting of "N" number of blocks, each block having a group of "n" number of sandwich type photodetecting elements 11'' (photo diodes P) arrayed on an insulating substrate made of glass, for example. The image sensor further includes a charge transfer section 12 consisting of thin film transistors T1,1 to TN,n coupled with the photodetecting elements 11'', a wire group 13 for connecting the charge transfer sections 12 between the adjacent blocks, an "n" number of common signal lines 14 led from the photodetecting elements in each block through the charge transfer section 12 and the wire group 13, and drive ICs 15a and 15b connected to the common signal lines 14.

The drive ICs 15a and 15b each include switches SW1 to SWn for time-sequentially transferring the potentials on the "n" number of the common signal lines 14 onto output line 17a or 17b (COM1 or COM2).

Figure 3:
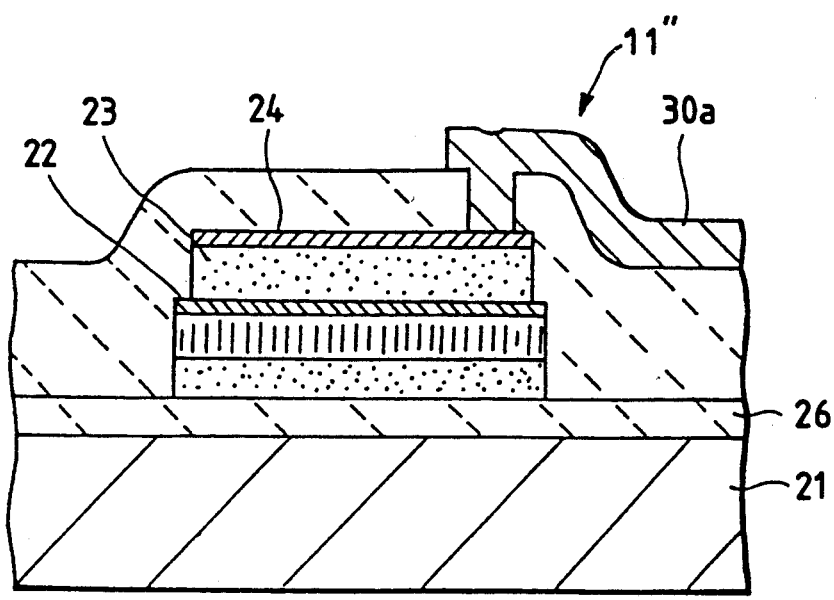
FIG. 3 is a cross sectional view taken on line A—A' in FIG. 2.

As shown in FIG. 2 and FIG. 3 showing a sectional view taken on line A—A' in FIG. 2, each photodetecting element 11" has a sandwich structure including an insulating layer 26 made of silicon nitride (SiNx), a strip-like metal electrode 22, a photoconductive layer 23, and an upper transparent electrode 24, which are layered in this order on a substrate 21 made of glass, for example. Further, a hydrogenerated amorphous silicon (a—Si: H) layer, and an n+ hydrogenerated amorphous silicon (n+ a—Si: H) layer are formed on the insulating layer 26. The metal electrode 22 made of chromium (Cr2) serves as a lower common electrode of the photodetecting element 11". The photoconductive layer 23 is made of hydrogenerated amorphous silicon (a—Si: H) and separately formed for each photodetecting element (bit) 11". The upper transparent electrode 24 is made of indium tin oxide (ITO) and separately formed for each photodetecting element.

The lower metal electrode 22, formed like a strip, extends in the first scan direction. The photoconductive layers 23 are discretely formed on the metal electrode 22. The upper transparent electrodes 24 are also discretely formed. The structure in which the photoconductive layer 23 is sandwiched by the metal electrode 22 and the transparent electrode 24, serves as one photodetecting element 11". The colligation of the photodetecting elements thus structured make up the photodetecting element array 11. A fixed voltage VB is applied to the metal electrode 22.

One end of each discrete transparent electrode 24 is connected to one end of a wire 30a made of aluminum. The other end of the wire 30a is connected to the lead portion 41' of the drain electrode 41 of the thin film transistor Ti,j (i=1 to N, and j=1 to n) in the charge transfer section 12. In the photodetecting element 11", hydrogenerated amorphous silicon of the photoconductive layer may be substituted by CdSe (cadmium selenium), for example. In this embodiment, the photoconductive layer 23 and the transparent electrode 24 are discretely formed. The reason for this follows. If the photoconductive layer 23 of a—Si: H is formed as a single layer, an optoelectric transducing operation, when it occurs in a specific photodetecting element 11", sometimes interferes with the adjacent photodetecting element 11". The interference must be reduced.

Figure 4:
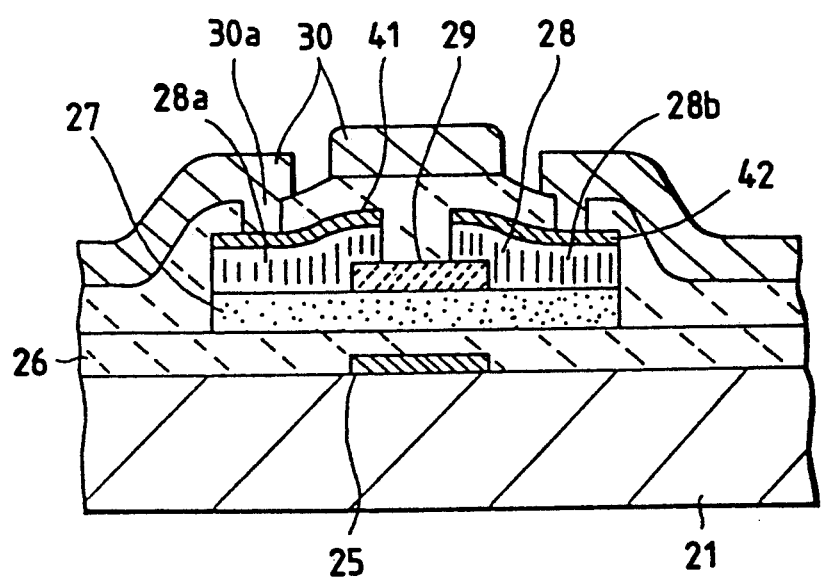
FIG. 4 is a cross sectional view taken on line B—B' in FIG. 2.

As shown in FIG. 2 and FIG. 4 showing a sectional view taken on line B—B, in FIG. 2, the thin film transistors (Ti, j) forming the charge transfer section 12 are transistors of the inverse staggered structure. In each transistor, a chromium (Cr1) layer, a silicon nitride (SiNx) film, an amorphous silicon (a—Si: H) layer, another silicon nitride film, an n+ amorphous silicon nitride (n+ a—Si: H) layer, a chromium (Cr2) layer, an insulating layer, and an aluminum layer 30 are layered in this order on the substrate 21. The chromium layer (Cr1) serves as a gate electrode 25. The silicon nitride film (SiNx) of an insulating layer 26 serves as a gate insulating film. The hydrogenerated amorphous silicon (a—Si: H) serves as a semiconductor active layer 27. The silicon nitride (SiNx) film serves as a top insulating layer 29 provided opposing the gate electrode 25. The n+ hydrogenerated amorphous silicon (n+ a—Si: H) layer serves as an ohmic contact layer 28. The chromium (Cr2) layer serves as a drain electrode 41 and a source electrode 42. The insulating layer is made of polyimide, for example.

The ohmic contact layer 28 consists of two separate layers 28a and 28b respectively brought into contact with the drain electrode 41 and the source electrode 42. The chromium (Cr2) layer also consists of two separate layers, the drain electrode 41 and the source electrode 42, which are layered over the ohmic contact layers. The aluminum wire 30a led from the transparent electrode 24 of the photodetecting element 11" is connected to the lead portion 41' led from the drain electrode 41. The aluminum common signal line 14 of the wire group 13 is connected to the source electrode 42.

This embodiment does not employ such a contact structure that the wire 30a is extended onto and directly made to contact with the drain electrode 41. In the embodiment, the chromium portion of the drain electrode 41 is led out to the photodetecting element 11", to form the lead portion 41'. The wire 30a is made to contact with the lead portion 41'. The contact structure of the embodiment may reduce the width of the thin film transistor, and saves the space within the chip. Therefore, the device like this embodiment is very useful where the thin film transistors are closely arrayed.

The construction of the wire group 13 will be described in detail with reference to FIGS. 1 to 5. In FIG. 5, the photodetecting elements 11" and the charge transfer section 12 for each block are expressed by a rectangular block for simplifying the explanation. The blocks are denoted as 1 to n.

In the construction of the wire group 13, as shown in FIG. 1, the common signal lines 14 (signal lines 1' to n') are led from the drive IC 15a located under the first block. The signal lines 1' to n' are extended and connected to the source electrodes 42 of the thin film transistors T1,1 to T1,n of the first block. Further, as shown in FIG. 2, the signal lines 1' to n' each pass on the insulating layer of polyimide between the adjacent photodetecting elements 11" and 11", in the form of a metal wire of aluminum (Al), for example. On the upper side of the photodetecting element array 11, the signal lines 1' to n' extend toward the second block, and each again passes on the insulating layer of polyimide between the adjacent photodetecting elements 11" and 11", in the form of a metal wire of aluminum. Those signal lines are connected to the source electrodes 42 of the thin film transistors T2,n to T2,1 of the second block.

To be more specific, the signal line 1' is connected to the source electrode 42 of the thin film transistor T1,1 of the first block, and the source electrode 42 of the thin film transistor T2,n of the second block. The signal line 2' is connected to the source electrode 42 of the thin film transistor T1,2 of the first block, and the source electrode 42 of the thin film transistor T2,n−1 of the second block. In this way, between the adjacent blocks, the source electrodes 42 of the thin film transistors T are connected to each other by means of the signal lines in order from the farthest transistors. The signal line n' is connected to the source electrode 42 of the thin film transistor T1,n of the first block, and the source electrode 42 of the thin film transistor T2,1 of the second block. In other words, between the adjacent blocks, the source electrodes of the thin film transistors are connected to each other by means of the signal lines in order from the closest transistors.

As shown in FIG. 5, the signal lines of the wire group 13 between the first block and second block are disposed above and along (extending in the first scan direction) the photodetecting element array 11. In connection with the array 11, those signal lines are laid out such that the signal lines are disposed close to the array 11 in order from the shortest signal line. The shortest signal line n' is located closest to the photodetecting element array 11. The signal line n'−1 is located secondly close to the array 11. The longest signal line 1' is located farthest from the array 11. With the layout of the signal lines as just mentioned, there is no intersection of the signal lines between the first and second blocks, and hence the crosstalk will not occur.

A specific arrangement of the wire group 13 between the second and third blocks will be described in detail. The source electrodes 42 of the thin film transistors T2,1 to T2,n in the second block are respectively connected to the source electrodes 42 of the thin film transistors T3,n to T3,1 in the third block by means of the signal lines n' to 1' disposed on the lower side of the photodetecting element array 11.

More specifically, the signal line n' is connected to the source electrode 42 of the thin film transistor T2,1 in the second block, and the source electrode 42 of the thin film transistor T3,n in the third block. The signal line n'−1 is connected to the source electrode 42 of the thin film transistor T2,2 in the second block, and the source electrode 42 of the thin film transistor T3,n−1 in the third block. In this way, between the adjacent blocks, the source electrodes 42 of the thin film transistors T are connected to each other by the signal lines in order from the farthest transistor. Further, the source electrode 42 of the thin film transistor T2,n in the second block is connected to the source electrode 42 of the thin film transistor T3,1 in the third block by the signal line 1'. In other words, between the adjacent blocks, the source electrodes 42 of the thin film transistors T are successively connected to each other by the signal lines in order from the closest transistor T.

As shown in FIG. 5, the signal lines of the wire group 13 between the second and third blocks are disposed under and along (extending in the first scan direction) the photodetecting element array 11. In connection with the array 11, those signal lines are laid out such that the signal lines are disposed close to the array 11 in order from the shortest signal. The shortest signal line 1' is located closest to the photodetecting element array 11. The signal line 2' is located secondly close to the array 11. The longest signal line n' is located farthest from the array 11. With the layout of the signal lines as just mentioned, there is no intersection of the signal lines between the second and third blocks, and hence the crosstalk will not occur.

An overall layout of the wires will be described with reference to FIG. 5. As shown, the wire groups 13 each connecting the transistors from the odd-numbered block to the even-numbered block are located on the upper side of the photodetecting element array 11. The wire groups 13 each connecting the transistors from the even-numbered block to the odd-numbered block are located on the lower side of the array 11. Therefore, the signal lines of the wire groups 13 connecting the odd-numbered block to the even-numbered block do not intersect those connecting the even-numbered block to the odd-numbered block. Thus, there is no intersection of the signal lines as a whole, and the crosstalk will not occur.

In this embodiment, the drive IC 15b is disposed on the lower side of the N-th block, which is an even-numbered block, as the drive IC 15a is disposed on the lower side of the first block.

The analog switches SW1 to SWn in the drive IC 15a are respectively connected to the signal lines 1' to n'. The signal lines to which the source electrodes 42 of the thin film transistors TN,1 to TN,n in the N-th block are connected, are connected to the drive IC 15b. The analog switches SW1 to SWn in the drive IC 15b are respectively connected to the signal lines n' to 1' led from the drive IC 15a.

The "n" number of common signal lines connected to the analog switches SW1 to SWn in the drive ICs 15a and 15b are derived from the wire groups 13. Charges stored in the wire capacitances of the signal lines of the wire groups 13 cause potentials to vary in the common signal lines 14. The varied potential values are picked up onto the output lines 17a and 17b (COM1 and COM2) by the operation of the analog switches. In the drive ICs 15a and 15b, the analog switches SW1 to SWn are operated in this order to read the potentials on the signal lines.

Fixed-potential wires lying among the signal lines will be described with reference to FIGS. 2 and 5.

The fixed-potential wires lying among the signal lines may be ground lines connected to earth. As shown in FIG. 5, each ground line 43 is disposed between the adjacent parallel signal lines which meander through the photodetecting element array 11. The ground lines 43 are metal layers made of aluminum like the signal lines. In design, the pitch of the ground lines is selected to preferably be equal to that of the signal lines.

In this embodiment, the ground lines 43 are connected to wires 44 made of chromium (Cr1) connected to earth lines (grounded), which are disposed on the upper and lower sides of the photodetecting element array 11. Also in the portion where the signal lines 14 are connected to the drive ICs 15a and 15b, the ground lines 43 are disposed among the common signal lines 14, and are connected to wires 44 which are disposed closer to the drive ICs 15a and 15b.

A specific construction of the ground lines 43 around the photodetecting elements 11'', the thin film transistors of the charge transfer section 12, and the photodetecting element array 11, will be described with reference to FIG. 2. On the upper side of the photodetecting element array 11, the ground lines 43 are disposed among the common signal lines 14, and extend along the common signal lines and connect the blocks, like the common signal lines 14 connecting the blocks. The ends of the ground lines 43 are connected, through contact holes, to the wires 44 made of chromium (Cr1) connected to the earth lines which are disposed close to the upper side of the photodetecting element array 11 and extends in the first scan direction.

The ground lines 43 on the lower side of the photodetecting element array 11, disposed among the common signal lines 14, are formed so that the ground lines lead, to the lower side of the photodetecting element array 11, aluminum layers 30 as a light shield metal layer to shield the a—Si: H layer of the thin film transistors from light. The ground lines 43 extend along the common signal lines and connect the blocks, like the common signal lines 14 connecting the blocks.

Each ground line 43 extends from the associated aluminum layer 30 as the light-shield metal layer in one block, and connects to the associated aluminum layer 30 in the block adjacent thereto. The ends of the ground lines 43 are connected, through contact holes, to the wires 44 made of chromium (Cr1) connected to the earth lines which are disposed close to the lower side of the photodetecting element array 11 and extend in the first scan direction.

As seen from FIG. 5 showing a layout of the wire groups, in this embodiment, the two ground lines 43 and a dummy wire 45 placed between the ground lines are disposed outside the signal line (signal line 1' or signal line n'), which is located farthest from the photodetecting element array 11. The reason why the ground lines and the dummy line are provided follows.

The signal line located farthest from the photodetecting element array 11 forms a load capacitance in cooperation with only the ground line 43, which is disposed on one side of the signal line, while the inner signal lines each form a load capacitance in cooperation with the ground lines on both sides thereof. For this reason, the load capacitances formed are not equal. To remove the problem, the ground line 43 is further disposed outside the outermost signal line. The use of the additional ground line makes the load capacitances uniform in value, and ensures the exact charge output.

The dummy wire 45 is connected to the source electrode of a switching element consisting of a thin film transistor (TFT), which is not included in the TFTs of the charge transfer section 12. The drain electrode of the TFT is connected to a dummy photo diode. The TFT portion coupled with the dummy wire 45 and the dummy photo diode portion make up dummy drivers 46a and 46b. The dummy drivers 46a and 46b are connected to a dummy gate pulse generator 47. Another portion of the dummy wire 45 is connected to a dummy reset circuit 48.

As shown in FIG. 5, the dummy driver 46a, which is coupled with the dummy wire 45 located above the array 11, is located on one side of the n-th combination of the photo diode and the thin film transistor in the N-th block, that is, on one side of the photodetecting element array 11. The dummy driver 46b, which is coupled with the dummy wire 45 below the array 11, is disposed on an area where the wire group 13 is formed.

In the wire layout of FIG. 5, in order to reduce the total length of the wire group 13, the wires of the wire group are horizontally, vertically and obliquely laid out. The area where nothing is formed is caused in the vicinity of the oblique wire portions. This area is used for the dummy driver 46b in this embodiment.

Thus, in the embodiment, the dummy driver 46b is not formed on the end portion of the array 11. Otherwise, when the dummy wire 45 under the array 11 is connected to the dummy driver 46b, the dummy wire 45 intersects the common signal lines 14.

The gate pulse generator 47 and the reset circuit 48 are provided outside the substrate 21, and are connected to the latter by the wire bonding technique, for example. If required, the circuits 47 and 48 may be fabricated into the drive IC 15a or 15b.

Next, a method of manufacturing the image sensor will be described.

To start, a first chromium (Cr1) layer is formed, with approximately 750 Å thickness, on the substrate 21 of glass, which has been inspected and washed, by the DC sputtering method. The first chromium (Cr1) layer serves as the gate electrodes 25 and as the wires 44 which are grounded in the wire group 13 and formed on both sides of the photodetecting element array 11, and formed closer to the drive IC 15a or 15b.

The Cr1 layer is patterned by the photolithographic process and etching process. The structure is subjected to the BHF process, and the alkali cleaning. Following this step, in order to form on the Cr1 pattern the insulating layer 26 for the thin film transistor (TFT) portion, semiconductor activate layers 27 layered on the insulating layer, and additional insulating layers 29 layered on the semiconductor activate layers, a silicon nitride (SiNx) film of approximately 3,000 Å thickness, a hydrogenerated amorphous silicon (a—Si: H) film of approximately 500 Å thickness, and a silicon nitride film (SiNx) of approximately 1,500 Å thickness are deposited in this order by the plasma CVD (P-CVD) method, while keeping a vacuum state.

The lower insulating layer 26 in the TFT is referred to as a bottom-SiNx (b-SiNx) film, and the top insulating layer 29 is referred to as a top-SiNx (t-SiNx) film. In this case, since those layers and films are continuously formed while keeping the vacuum state, the interfaces between each of them can be kept clean and hence a better S/N ratio of the resultant product can be gained.

The conditions for forming the b-SiNx film by the P-CVD method are as follows: substrate temperature of 300° to 400° C., gaseous pressure for $SiH_4$ and $NH_3$ of 0.1 to 0.5 Torr, flow rate for $SiH_4$ of 10 to 50 sccm, flow rate for $NH_3$ of 100 to 300 sccm, and RF power of 50 to 200 W.

The conditions for forming the a—Si: H film by the P-CVD method are as follows: substrate temperature of 200° to 300° C., gaseous pressure for $SiH_4$ of 0.1 to 0.5 Torr, flow rate for $SiH_4$ of 100 to 300 sccm, and RF power of 50 to 200 W.

The conditions for forming the t-SiNx film by the P-CVD method are as follows: substrate temperature of 200° to 300° C., gaseous pressure for $SiH_4$ and $NH_3$ of 0.1 to 0.5 Torr, flow rate for $SiH_4$ of 10 to 50 sccm, flow rate for $NH_3$ of 100 to 300 sccm, and RF power of 50 to 200 W.

To conform the top insulating layers 29 to a pattern of the gate electrodes 25, the top insulating layer 29 is patterned in the following manner. The upper surface of the top insulating layer 29 is coated with resist. First the resist film is exposed to light from the rear side of the substrate 21 using the pattern of the gate electrodes as a mask and second from the front side of the substrate 21 using another mask, and is developed.

Subsequently, the structure is subjected to the BHF process, and an n+ a—Si: H layer as the ohmic contact layer 28 is deposited thereon, with approximately 1,000 Å thickness by the P-CVD method.

A second chromium (Cr2) layer, which is to be used as the drain electrodes 41 and the source electrodes 42 of the TFTs, and the lower metal electrodes 22 of the photodetecting elements 11'', is deposited with 1,500 Å thickness, by the DC magnetron sputtering method. Next, an a—Si: H to be used as the photoconductive layers 23 of the photodetecting elements 11'' is deposited, with approximately 13,000 Å thickness, by the P-CVD method. Therefore, an ITO film to be used as the transparent electrodes 24 of the photodetecting elements 11'' is deposited, with approximately 600 Å thickness, by the DC magnetron sputtering method. Before the forming of those films, the alkaline cleaning is required for the surfaces on which the films are to be deposited.

Afterwards, to form the discrete transparent electrodes 24 of the photodetecting elements 11'', the ITO film is patterned by the photolithographic process and the etching process. Using the same resist pattern, the a—Si: H layer for the photoconductive layers 23 is patterned by the dry-etching process. The chromium (Cr2) layer for the metal electrodes 22 serves as a stopper and is left without being patterned. Since side etching occurs greatly in the a—Si: H layers of the photoconductive layers 23 during the dry-etching process, the ITO film is again subjected to the etching process before the resist film removal The ITO film is further etched from its periphery of the rear side, so that the ITO film formed has a size equal to that of the a—Si: H of the photoconductive layer 23.

The conditions for forming the a—Si: H film by the P-CVD method are as follows: substrate temperature of 170° to 250° C., gaseous pressure for SiH4 of 0.3 to 0.7 Torr, flow rate for SiH4 of 150 to 300 sccm, and RF power of 100 to 200 W.

Further, the conditions for forming the ITO film by the DC sputtering method are as follows: gaseous pressure for Ar and O2 of $5 \times 10^{-3}$ Torr, flow rate for Ar gas of 100 to 150 sccm, flow rate for O2 gas of 1 to 2 sccm, and DC power of 200 to 400 W.

The chromium layer Cr2, which is to be used as the chromium layers of the metal electrodes 22 of the photodetecting elements 11" and the chromium layers of the drain electrodes 41 and the source electrodes 42 of the TFTs, is patterned by the photolithographic process and the etching process. The n+ a—Si: H layer serving as the lower layer for the chromium layers of the metal electrodes 22 of the photodetecting elements 11, and the n+ a—Si: H layer for the ohmic contact layers 28 of the TFTs are both etched by using the same resist pattern.

Next, to form a pattern of the gate insulating layers 26 of the TFTs, the b-SiNx layer is patterned by the photolithographic etching process. An insulating layer of polyimide of approximately 11,500 Å thickness is applied so as to cover the image sensor, and the structure is pre-baked and subjected to photolithographic etching process to form contact portions, and is baked again. As a result, in the photodetecting elements 11", the following portions are formed; the contact portions to supply electric power to the metal electrodes 22 and the portions to pull charges out of the transparent electrodes 24. In the TFTs, the wires are formed 30a for transferring charges generated in the photodetecting elements 11", and the contact portions are formed to lead charges to the wire group 13. Thereafter, to completely remove the polyimide left on the contact portions, the structure is subjected to Descum process in which it is placed in a plasma atmosphere of O2.

Subsequently, an aluminum (Al) layer of 15,000 Å thickness is deposited so as to entirely cover the image sensor by the DC magnetron sputtering method. The aluminum layer is subjected to the photolithographic etching process to form a desired pattern. As a result, in the photodetecting elements 11", formed is a wire pattern including the wire portions to supply electric power to the metal electrodes 22, the wire portions 30a to pull charges out of the transparent electrodes 24 and to connect to the drain electrodes 41 of the TFTs. Further, in the wire group 13, the wire pattern of the common signal lines 14 to be connected to the source electrodes 42 of the TFTs, the wire pattern of the ground lines 43, and the wire pattern of the dummy wire 45 are formed.

Finally, the structure is coated with polyimide to serve as a passivation layer (not shown). The polyimide-coated structure is pre-baked, subjected to photolithographic etching process for patterning, and is further backed to form the passivation layer. The resultant structure is subjected to the Descum process to remove the polyimide still left.

Afterwards, the drive ICs 15a and 15b, gate pulse generator 47, reset circuit 48, and the like are mounted to the semiconductor structure thus formed, then wire bonded, and assembled, thereby to complete the image sensor.

The common signal lines 14, coupled with the source electrodes 42 of the TFTs, meander through the photodetecting element array 11 or the photodetecting element array row, and the entire common signal lines are made of aluminum (Al). Therefore, the resistance of the common signal lines 14 is reduced as a whole.

Next, a method of driving the image sensor thus constructed will be described.

When an original document (not shown) placed on the photodetecting element array 11 is illuminated with light emitted from a light source (not shown), the light reflected on the original illuminates the photodetecting elements (photo diodes P) to cause the photodetecting elements to generate charges according to the light and shade on the original. The generated charges are stored in the parasitic capacitances of the photodetecting elements 11" and the like. In response to a gate pulse $\phi G$ applied from a gate pulse generator (not shown) through the gate signal line Gi, the transistors T are turned on to connect the photo diodes PD and the common signal line, so that the charges stored in the parasitic capacitances of the photodetecting elements 11" and the like are transferred to the wire capacitances of the common signal lines of the wire group 13.

The drive ICs 15a and 15b are alternately operated to output the charges that are fed from the photodetecting element array 11" of the even-numbered blocks to the common signal lines 14, and the charges that are fed from the photodetecting element array 11" of the odd-numbered blocks to the common signal lines 14. The output line COM 1 of the drive IC 15a and the output line COM 2 of the drive IC 15b are connected so that the image data signals are outputted, for each block, from an output line COM (not shown) in a time-sequential manner.

Here, a specific operation of the dummy wire 45 will be described with reference to FIGS. 6 and 7.

Figure 6:
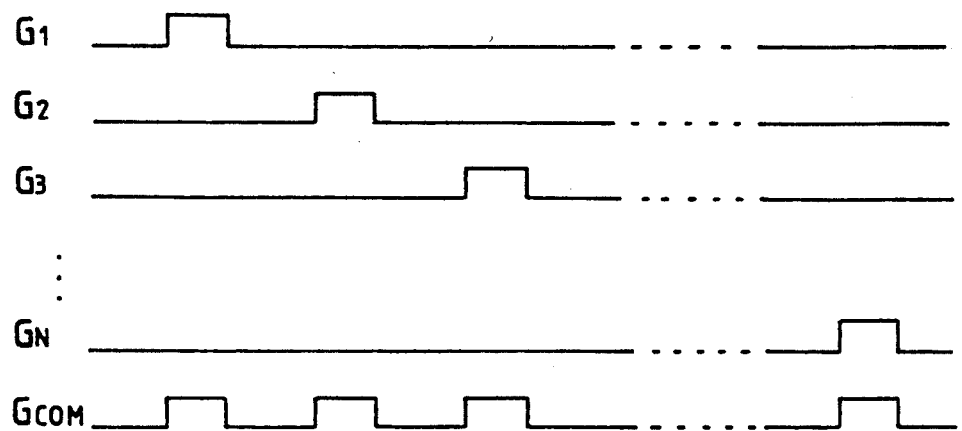
FIG. 6 is a waveform diagram showing waveforms of gate pulses in the embodiment.

FIG. 6 is a diagram showing a set of waveforms of gate pulses that are applied from the gate signal lines G to the respective blocks, and to the gate electrode of the thin film transistors of the dummy drivers 46a and 46b.

The gate pulses applied to the blocks in the photodetecting element array 11 are gate pulses $\phi G1$ to $\phi Gn$ that are applied from a single gate pulse generator through the gate signal lines G1 to GN in this order. The gate pulse to the gate electrodes of the thin film transistors of the dummy drivers 46a and 46b is a pulse, which is applied from the gate pulse generator 47 onto the gate signal line G COM connected to the dummy drivers 46a and 46b in synchronism with the pulses on all the gate signal lines G1 to GN.

Figure 7:
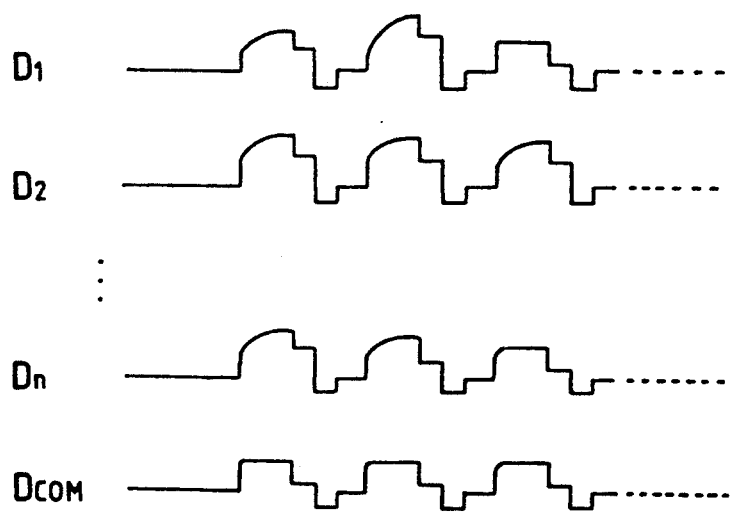
FIG. 7 is a waveform diagram showing waveforms of voltage signals on the signal lines and a dummy wire.
Figure 8:
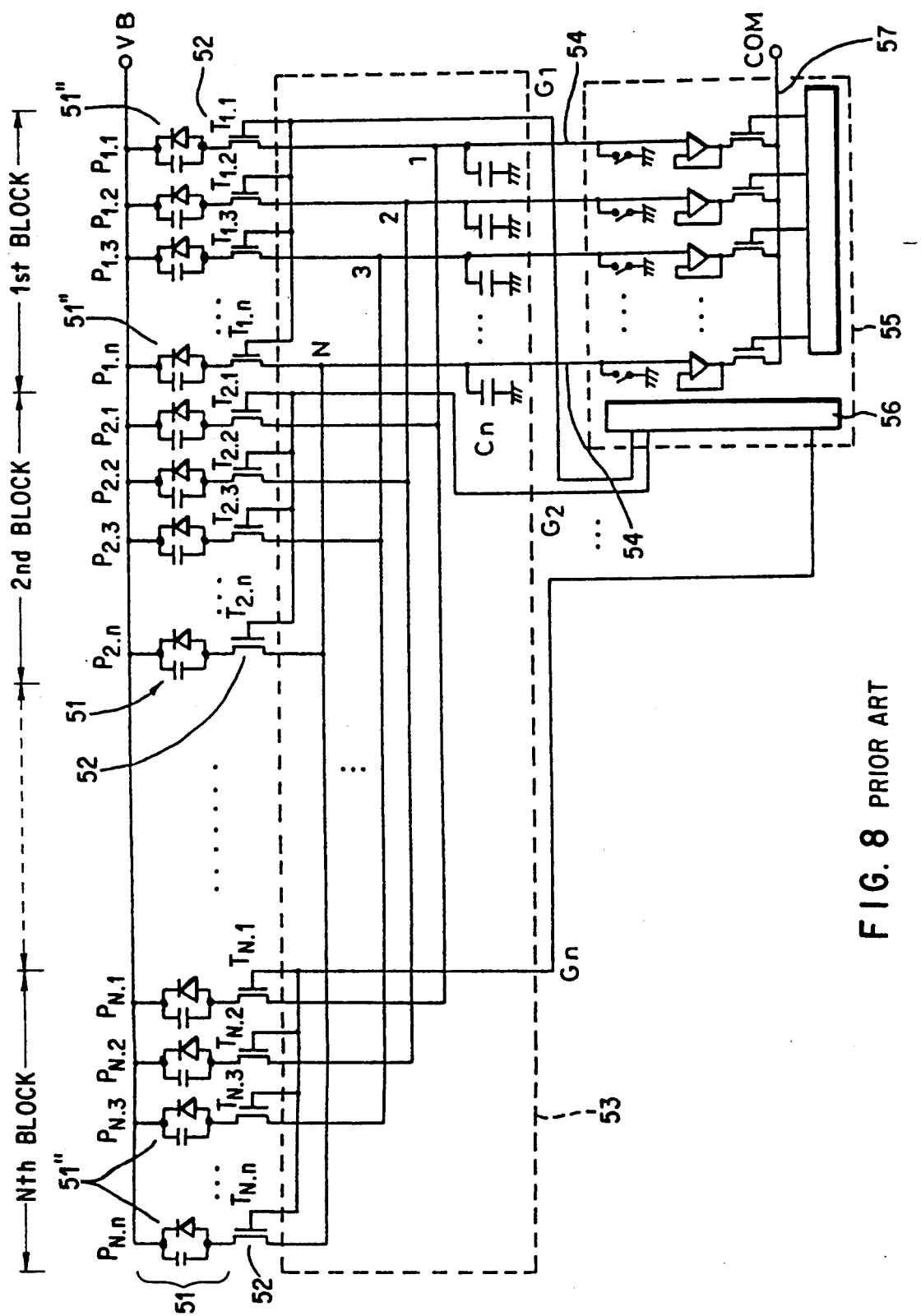
FIG. 8 is an equivalent circuit diagram showing a conventional image sensor.
Figure 9:
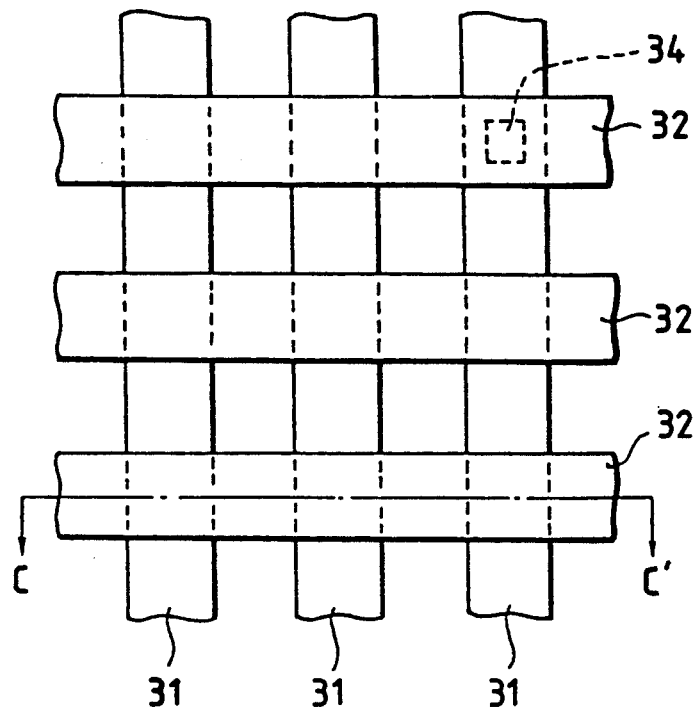
FIG. 9 is a plan view showing a conventional multi-layered wiring structure.
Figure 10:
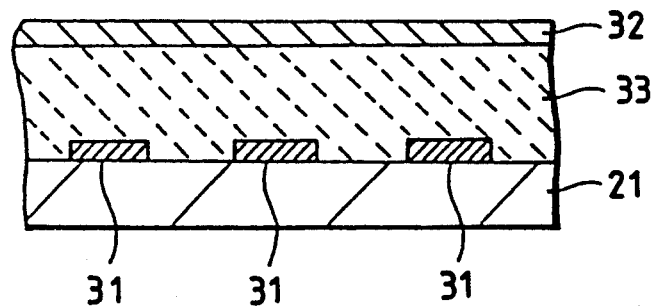
FIG. 10 is a cross sectional view taken on line C—C' in FIG. 9.

With the application of the gate pulse from the gate pulse generator 47, a voltage waveform D COM on the dummy wire 45 is in synchronism with the voltage waveforms D1 to Dn on the signal lines 1' to n', as shown in FIG. 7.

The voltage waveforms D1 to Dn on the common signal lines instantaneously rise in response to the gate pulses from the gate signal lines. If the charges are stored in the photodetecting element side, the charges are transferred and those potentials further increase. Then, the potentials on the common signal lines are read and the signal lines are reset. Subsequently, in response to the gate pulses from the gate signal lines, the above sequence of the operations is repeated. The result is formation of the waveforms shown in FIG. 7. In this case, the dummy photo diode does not receive light. Accordingly, only the influence by a feed-through, in which the potential instantaneously rises owing to an intensive voltage of the gate pulse, occurs in the voltage waveform D COM of the dummy wire. The potential rise caused by the charge transfer does not occur.

A potential variation by the feed-through may be caused to occur on the dummy wire 45, as on the signal lines. Therefore, also in the signal line, which is located farthest from the photodetecting element array 11, a similar electrical environment may be established in the signal lines within the wire group 13.

As described above, according to the embodiment, a plurality of photodetecting elements 11" are grouped into a plurality of blocks. The common signal lines 14, which connect the source electrodes 42 of the thin film transistors connecting the photodetecting elements 11" in a block to the source electrodes 42 of the thin film transistors connecting the photodetecting elements 11" in a block adjacent thereto are wired in such a manner that the source electrodes 42 of the thin film transistors in the block are connected to the source electrodes 42 of the thin film transistors in the adjacent block in order from the shortest distance between the source electrodes in the respective blocks. The common signal lines 14, which connect the source electrodes 42 of the thin film transistors connecting the photodetecting elements 11" in a block to the source electrodes 42 of the thin film transistors connecting the photodetecting elements 11" in a block adjacent thereto are disposed oppositely with respect to the first scan direction of the photodetecting element array 11, and are disposed in such a way that the shortest signal line 14 connecting them is located closest to the photodetecting element array 11, the next shortest signal line 14 is located next closest to the photodetecting element array 11, and so on. Further, a ground line 43 is disposed between the common signal lines 14, and another ground line 43 is disposed outside the signal line (signal line 1' or n') located farthest from the photodetecting element array 11. The dummy wire 45 for generating a voltage waveform in synchronism with that on each signal line, the polarity of both the voltage waveforms being the same, is disposed outside the ground line 43 located farthest from the photodetecting element array. Still another ground line 43 is disposed outside the dummy wire 45.

With such an arrangement, there is no intersection of the signal lines. The wires each disposed between the adjacent signal lines 14 laid out in parallel prevents the crosstalk between the signal lines. The combination of the ground line 43 disposed outside the signal line which is located farthest from the photodetecting element array 11, the dummy wire 45, and the ground line 43 disposed outside the wire 45 establishes the same electrical environment in the outermost signal line as that in any of the inner signal lines. The resultant image sensor can exactly read the charges out of the capacitors of wiring capacitances, and realize the improvement of the tone reproduction performance.

With use of the ground wires 43 each disposed between the adjacent common signal lines 14, the load capacitors can be formed using a small chip area, leading to the size reduction of the image sensor.

Additionally, in the embodiment, the potential on the dummy wire 45 is varied such that a feed-through phenomenon in which the potential on a signal line instantaneously rises owing to the gate pulse applied occurs also in the dummy wire 45. With this, the same electrical environment as that in the inner signal lines in the wire group 13, may be established also in the signal line disposed farthest from the photodetecting element array 11. The output potentials of the image sensor can be made uniform.

What is claimed is:

1. An image sensor comprising:
   a photodetecting element array including N blocks of photodetecting elements linearly arrayed in a first scan direction and formed on a surface of said image sensor;
   a linear array of n photodetecting elements extending in said first scan direction within each of said blocks;
   a linear array of n switching elements extending in said first scan direction within each block, each of the switching elements within a given block of said blocks being connected to a respective photodetecting element within said given block for transferring charge generated by said respective photodetecting element;
   a drive IC, connected to each of said switching elements, for outputting the transferred charges in the form of an image signal;
   a plurality of signal lines, each of said signal liens connecting a switching element of one of said blocks to a respective switching element of a block adjacent to said one block to interconnect switching elements of adjacent blocks in order of linear proximity to each other, said plurality of signal lines being disposed on said surface of said image sensor such that each of said signal lines has a respective length and is located at a respective distance from said photodetecting array, said length and distance being proportional to the proximity of the respective switching elements connected to each other by the signal line, wherein signal liens connecting proximal switching elements are shortest and located closest to said photodetecting array, and signal lines connecting distal switching elements are longest and located farthest from said photodetecting array;
   a plurality of first wires at a fixed potential, each of said first wires being disposed on said surface between a respective pair of adjacent signal lines;
   a plurality of second wires at the fixed potential, each of said second wires disposed on said surface outside a respective signal line located farthest from the photodetecting element array; and
   a dummy wire disposed on said surface outside each of said plurality of second wires, said dummy wire carrying a voltage waveform in synchronism with that on each of said signal lines, the polarity of the voltage waveform of the dummy wire and the voltage waveform on each of said signal lines being the same.

2. An image sensor according to claim 1, further comprising a dummy driver for generating the voltage waveform on the dummy wire, wherein each of said first, second and dummy wires has a portion disposed on said surface oblique to said photodetecting element array, and said dummy driver is disposed on said surface adjacent to said oblique portions.

3. An image sensor as defined in claim 1, further comprising a plurality of third wires at the fixed potential disposed on said surface outside said dummy wire.

4. An image sensor according to claim 3, further comprising a dummy driver for generating the voltage waveform on the dummy wire, wherein each of said first, second and dummy wires has a portion disposed on said surface oblique to said photodetecting element array, and said dummy driver is disposed on said surface adjacent to said oblique portions.

* * * * *

UNITED STATES PATENT AND TRADEMARK OFFICE
CERTIFICATE OF CORRECTION

PATENT NO. : 5,198,905
DATED : March 30, 1993
INVENTOR(S) : Hiroyuki Miyake

It is certified that error appears in the above-identified patent and that said Letters Patent is hereby corrected as shown below:

TITLE PAGE:

Abstract, title page, line 3, change "compromising" to --comprising--.

Claim 1, column 14, line 32, change "liens" to --lines--.

Claim 1, column 14, line 45, change "liens" to --lines--.

Signed and Sealed this

Nineteenth Day of April, 1994

Attest:

BRUCE LEHMAN

Attesting Officer Commissioner of Patents and Trademarks